(12) United States Patent
Herschbein et al.

(10) Patent No.: US 7,781,733 B2
(45) Date of Patent: Aug. 24, 2010

(54) IN-SITU HIGH-RESOLUTION LIGHT-OPTICAL CHANNEL FOR OPTICAL VIEWING AND SURFACE PROCESSING IN PARALLEL WITH CHARGED PARTICLE (FIB AND SEM) TECHNIQUES

(75) Inventors: Steven B. Herschbein, Hopewell Junction, NY (US); Herschel M. Marchman, Ashburn, VA (US); Narender Rana, Albany, NY (US); Chad Rue, Portland, OR (US)

(73) Assignee: International Business Machines Corporation, Armonk, NY (US)

( * ) Notice: Subject to any disclaimer, the term of this patent is extended or adjusted under 35 U.S.C. 154(b) by 341 days.

(21) Appl. No.: 11/749,350

(22) Filed: May 16, 2007

(65) Prior Publication Data
US 2008/0283777 A1   Nov. 20, 2008

(51) Int. Cl.
*H01J 40/14*   (2006.01)
*G01N 23/00*   (2006.01)
*G21K 7/00*    (2006.01)

(52) U.S. Cl. .............. 250/310; 250/215; 250/492.3

(58) Field of Classification Search .......... 250/306, 250/307, 310, 311, 492.1, 492.21, 201.1, 250/59.01, 215; 359/385, 388–390, 434–435, 359/363, 350, 351, 831, 833–837, 639, 340
See application file for complete search history.

(56) References Cited

U.S. PATENT DOCUMENTS

| | | | |
|---|---|---|---|
| 3,880,499 A * | 4/1975 | Miller | 359/833 |
| 4,070,090 A * | 1/1978 | Farr et al. | 359/737 |
| 4,380,076 A * | 4/1983 | Bethune | 372/54 |
| 5,394,268 A * | 2/1995 | Lanni et al. | 359/386 |
| 6,881,964 B2 * | 4/2005 | Holmes | 250/492.1 |
| 6,885,445 B2 * | 4/2005 | Bennett et al. | 356/301 |
| 7,045,791 B2 * | 5/2006 | Benas-Sayag et al. | 250/396 R |
| 2002/0101593 A1 * | 8/2002 | Yang et al. | 356/484 |
| 2004/0108458 A1 * | 6/2004 | Gerlach et al. | 250/311 |
| 2004/0252370 A1 * | 12/2004 | Giardini et al. | 359/368 |

(Continued)

OTHER PUBLICATIONS

M. Suzuki, T. Fujii, T. Onuki, M. Miyashita, M. Matushiro; Scanning Tunneling Microscope Coaxially Arranged With An Optical Microscope; 1992—Elsevier Science Publishers B.V.

*Primary Examiner*—Jack I Berman
*Assistant Examiner*—Brooke Purinton
(74) *Attorney, Agent, or Firm*—DeLio & Peterson, LLC; Kelly M. Nowak; Ian D. MacKinnon (57) ABSTRACT

An apparatus for simultaneous parallel processing of a sample using light energy for optical viewing or surface processing in parallel with a charged particle beam. A charged particle beam transmits a focused ion beam or an electron beam along a path to a sample. An optical microscope transmits light along a first path to the sample, and a prism aligned along the first light path reflects light into a second light path toward the sample. A portion of the prism and reflective surface is removed for passage of the charged particle beam. A lens is aligned along the second light path and has a portion removed for passage of the charged particle beam. The removed portions of the prism and lens are aligned along the charged particle beam path to permit parallel delivery of the charged particle beam and the light to substantially the same portion of the sample.

20 Claims, 7 Drawing Sheets

U.S. PATENT DOCUMENTS

2006/0097159 A1 5/2006 Herschbein et al.
2008/0073524 A1* 3/2008 Nishiyama et al. .......... 250/307

2008/0185509 A1* 8/2008 Knowles .................... 250/251

* cited by examiner

IN-SITU HIGH-RESOLUTION LIGHT-OPTICAL CHANNEL FOR OPTICAL VIEWING AND SURFACE PROCESSING IN PARALLEL WITH CHARGED PARTICLE (FIB AND SEM) TECHNIQUES

BACKGROUND OF THE INVENTION

1. Field of the Invention

The present invention relates to focused ion beam tools and in particular to a system and method of permitting optical viewing and surface processing of semiconductor wafers and associated devices in parallel with ion beam processing of those wafers.

2. Description of Related Art

Focused ion beam (FIB) toots are widely used in processing of semiconductor wafers and associated devices (collectively referred to as electronic devices), particularly in circuit editing, failure analysis (FA) and mask repair applications. FIB tools have the ability to sputter away or deposit materials over selected microscopic areas. Though FIB tools are useful and powerful, they have limitations towards some applications. In circuit editing, for example, copper features are difficult to sputter cleanly with an ion beam, and new low dielectric constant (low-k) materials can be damaged by the FIB tool's gallium ion beam. In mask repair applications, the gallium ion beam can cause staining of the quartz mask substrate. It would be beneficial to have an alternative energy source to the use of a gallium ion beam in such instances.

FIB manufacturers, recognizing the benefits of optical viewing in a FIB tool, have incorporated microscopes into their tools. FEI Company of Hillsboro, Oreg. has incorporated an off-axis microscope in its VectraVision tools. However, the sample must be shuttled back and forth between the FIB and the optical microscope positions, so the user does not have the ability to perform real-time optical viewing during FIB processing. Additionally, the user cannot promote photochemistry at the surface. Credence Corporation of Milpitas, Calif. has incorporated an in-line microscope to an FIB, but it has a very large working distance and hence a relatively low resolution. Additionally, like the FEI tool, there is no possibility to use the microscope for optically-induced chemical modifications on the surface. It would be useful to be able to optically view the specimen surface during processing using FIB or other charged particle techniques such as scanning electron microscopy (SEM).

SUMMARY OF THE INVENTION

The problems related to FIB processing arise because the gallium ion beam is the sole source of activating energy. Some of these problems could be overcome if, in addition to the energy provided by the FIB ion beam, one could introduce light energy to the surface. For example, a high-resolution optical microscope would allow non-destructive and non-staining optical viewing and navigation while FIB processing is being performed. Photo-induced chemical reactions for removing or depositing materials could also be exploited without exposing the surface to the ion beam. Alternatively, in conjunction with beam energy, possible unique reaction dynamics may be created. For instance, impact sputtering could slowly expose new surfaces, while the photon induced chemistry converts the surface. As an example, light and oxygen might convert a polycrystalline material into an amorphous oxide, and the ion beam sputters it away. The result would be a potentially more uniform removal rate, that avoids ion channeling effects.

Bearing in mind the problems and deficiencies of the prior art, it is therefore an object of the present invention to provide a system and method for simultaneous optical viewing and ion beam processing of an electronic device.

It is another object of the present invention to enable in an FIB tool the ability to make photochemical reactions to be made on the surface of an electronic device by delivering high-intensity light to the surface of the device.

It is a further object of the present invention to provide a high-resolution optical microscope that provides a working light energy beam that is coincident with the ion beam of an FIB tool.

It is yet another object of the present invention to provide in an FIB tool a light microscope is designed for parallel processing, so that the FIB tool's ion beam can be used simultaneously with the optical microscope.

A further object of the invention is to provide a system and method for high-resolution optical viewing, optically-induced photochemistry, and FIB processing all at the same time, to permit circuit edit, mask repair, failure analysis and other processing of electronic devices.

Still other objects and advantages of the invention will in part be obvious and will in part be apparent from the specification.

The above and other objects, which will be apparent to those skilled in the art, are achieved in the present invention which is directed to an apparatus for simultaneous parallel processing of a sample using light energy for optical viewing or surface processing in parallel with a charged particle beam. The apparatus comprises a charged particle beam generator for transmitting a charged particle beam along a path to a sample and a light energy delivery apparatus. The light energy delivery apparatus includes a light energy source for transmitting light energy along a first path to the sample, and a prism having an internal reflective surface aligned along the first light energy path to reflect light energy into a second light energy path toward the sample. A portion of the prism and reflective surface is removed for passage of the charged particle beam. The light energy delivery apparatus also includes a lens adapted to be aligned along the second light energy path and having a portion removed therefrom for passage of the charged particle beam. The removed portions of the prism and lens are adapted to be aligned along the charged particle beam path to permit parallel delivery of the charged particle beam and the light energy to substantially the same portion of the sample.

The light energy delivery apparatus preferably comprises an optical microscope. The lens is adapted to transmit light energy reflected from the sample. A first optical path transmits the light energy from the light energy source to the prism, and a second optical path transmits light energy reflected from the sample through the lens and prism reflective surface to a light energy detector. More preferably, the first optical path is vertically separated from the second optical path. The light energy delivery apparatus is adapted to deliver a light energy to the sample for surface processing of the sample by a light energy induced reaction. The light energy delivery apparatus may also include a combination of a light energy delivery system for surface processing and an optical microscope.

The lens may have an opening in a center portion thereof aligned along the charged particle beam path for passage of the charged particle beam toward the sample. The opening may be a substantially circular opening in a center portion of the lens, or a slot extending from an edge toward a center portion of the lens. The lens may also have a substantial portion thereof removed, preferably approximately half of the lens removed, with the removed portion being aligned along the charged particle beam path for passage of the charged particle beam toward the sample.

The apparatus may further include a motion stage attached to the light energy delivery apparatus for moving the prism and lens into an out of the path of the charged particle beam.

The charged particle beam generator may be an ion beam generator and the charged particle beam a focused ion beam, or the charged particle beam generator may be an electron beam generator and the charged particle beam an electron beam.

In another aspect, the present invention is directed to a method for simultaneous parallel processing of a sample using light energy for optical viewing or surface processing in parallel with a charged particle beam. The method comprises providing a charged particle beam generator for transmitting a charged particle beam along a path to a sample and a light energy delivery apparatus. The light energy delivery apparatus includes a light energy source for transmitting light energy along a first path to the sample, and a prism having an internal reflective surface aligned along the first light energy path to reflect light energy into a second tight energy path toward the sample. A portion of the prism and reflective surface is removed for passage of the charged particle beam. The tight energy delivery apparatus also includes a lens adapted to be aligned along the second light energy path and having a portion removed therefrom for passage of the charged particle beam. The removed portions of the prism and lens are adapted to be aligned along the charged particle beam path to permit parallel delivery of the charged particle beam and the light energy to substantially the same portion of the sample. The method then includes delivering light energy from the light energy source of the light energy delivery apparatus through the first light energy path, reflecting the light energy from the prism reflective surface to the second light energy path, through the lens and onto a portion of the sample, and simultaneously transmitting a charged particle beam from the charged particle beam generator along a path through the removed portions of the prism and lens to substantially the same portion of the sample as the light energy.

The lens may have a portion removed from a central optical axis of the lens, and the method includes transmitting the charged particle beam through the lens central optical axis. The removed portion of the lens may have a substantially circular opening in a center portion thereof, or a slot extending from an edge toward a center portion thereof. The lens may have a significant portion removed, preferably approximately half of the lens.

Preferably, the light energy delivery apparatus comprises an optical microscope, wherein the lens transmits light energy reflected from the sample, a first optical path transmits the light energy from the light energy source to the prism, and a second optical path transmits light energy reflected from the sample through the lens and prism reflective surface to a light energy detector. More preferably, the first optical path is vertically separated front the second optical path.

The light energy delivery apparatus may deliver light energy to the sample for surface processing of the sample by a light energy induced reaction.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

In describing the preferred embodiment of the present invention, reference will be made herein to FIGS. 1-7 of the drawings in which like numerals refer to like features of the invention.

Figure 1:
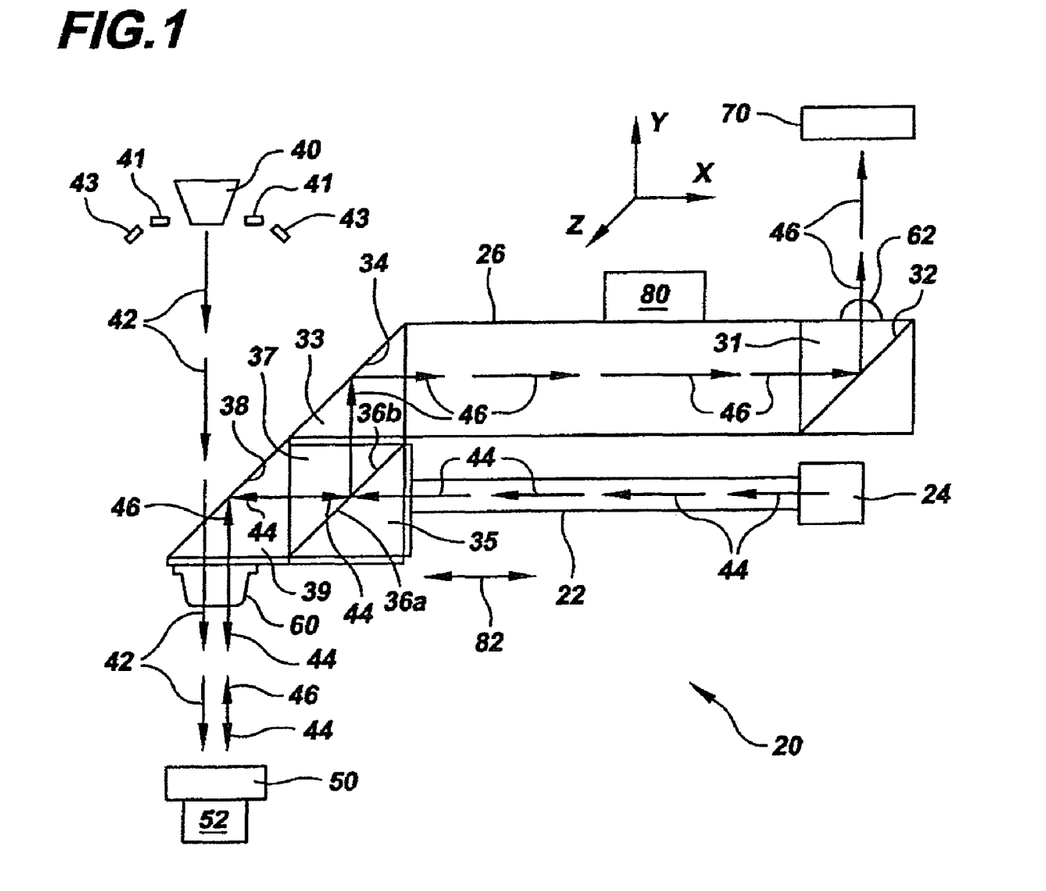
FIG. 1 is a side elevational view of the preferred optical channel viewing and light energy delivery device of the present invention incorporated into a focused ion beam tool.

FIG. 1 illustrates in schematic view a preferred embodiment of the optical channel viewing and processing device of the present invention. A sample 50, such as an electronic device or other object, is mounted on a stage 52 movable in the x-, y- and z-directions. An otherwise conventional focused ion beam (FIB) tool comprises an ion beam source 40 that generates ion beam 42 that strikes the upper surface of sample 50, generating secondary electrons and secondary ions (not shown). A microchannel plate or other charged particle detector 41 is disposed azimuthally about the ion beam 42. Detector 41 is either positively biased to attract secondary electrons in the electron mode, or negatively biased to attract secondary ions in the ion mode. A conversion dynode 43 azimuthally positioned about detector 41 may be added to increase total current in the detector. A suitable FIB tool is described in U.S. Patent Publication No. 2006/0097159, the disclosure of which is hereby incorporated by reference. Alternatively, the present invention may be used with a scanning electron microscope (SEM) or other charged particle device, which then may be substituted for the FIB tool shown in FIG. 1.

The optical microscope viewing and light energy delivery device of the present invention is shown in FIG. 1 as assembly 20. Assembly 20 includes a pair of vertically separated parallel solid rod lens (SRLs) 22, 26 above and below each other and adapted to pass visible light energy therethrough along their longitudinal axes. SRLs are typically made of fused silica, quartz, or similar materials. Lower SRL 22 has a light source 24 disposed at one end which emits light energy rays 44, and forms an optical light energy path to triangular reflective prism 35 connected at the opposite end of the SRL. The prisms disclosed herein are also typically made of fused silica, quartz, or similar materials. Prism 35 is stacked against triangle prism 37, which is itself stacked against triangle prism 39. Prism 35 has an internal oblique surface 36a that does not completely reflect rays 22 of light energy, but instead permits them to pass through surface 36a into adjacent triangular prism 37. An otherwise conventional "beamsplitter" prism may be utilized, in which the transmission/reflection ratio may be specified for the internal surfaces. Light rays 44 may continue horizontally as shown through prism 37 and into prism 39, whereupon they are reflected 90° by oblique internal reflective surface 38 downwardly along a path through a micro-objective lens 60 and onto the upper surface of sample 50. The reflective surfaces are formed by aluminum coated over the optically clear prism. Light rays 44 may comprise illuminating radiation, to permit the microscope portion to view the surface of sample 50, or higher power light energy, to cause photo-induced chemical reactions or other light-induced reaction on the sample surface. Light energy delivery apparatus 20 may include a combination of a high power light energy delivery system and an optical viewing microscope system.

The reflected image from the illuminated sample 50 surface is carried in light rays 46 which pass upwards along a path through the same micro-objective lens 60, and are sequentially reflected in paths 90° each off the oblique internal reflective surfaces of three prisms-internal reflective surface 38 of prism 39, internal reflective surface 36*b* of prism 37 and internal reflective surface 34 of prism 33. Light image rays 46 then travel horizontally as shown through upper SRL 26 that forms an optical light energy path and carries the optical image to another triangular reflective prism 31 at the end of the SRL opposite prism 33. The light image rays 46 are redirected 90° by the oblique internal reflective surface 32 of prism 31 vertically upward along a path into another lens 62 which focuses the image onto a light energy detector such as charge-coupled device (CCD) camera 70.

The entire assembly 20 in placed into the FIB tool vacuum chamber (not shown) and is compact enough to occupy the space between the final pole piece of the FIB column and the sample. The assembly rides on a precision x-y-z motion stage 82, so that it may be extended and retracted as shown by arrow 82 into and out of viewing position without breaking vacuum. Prism 39 of assembly 20 is movable into and out of the path of ion or other charged particle beam 42, and both prism 39 and lens 60 have been physically modified to allow the charged particle beam 42 to pass through the optical components and strike sample 50 near the center of the optical field-of-view of light rays 44, 46. This is preferably accomplished in one of three ways: 1) a circular hole may be drilled through the center of the objective lens 60 and also through the corresponding area of prism 39 above it, 2) a slotted groove may be placed along the side of the lens 60/prism 39 assembly, extending to and incorporating the central axis of lens 60; or 3) approximately half of lens 60 may be ground away to make a half lens.

Figure 2:
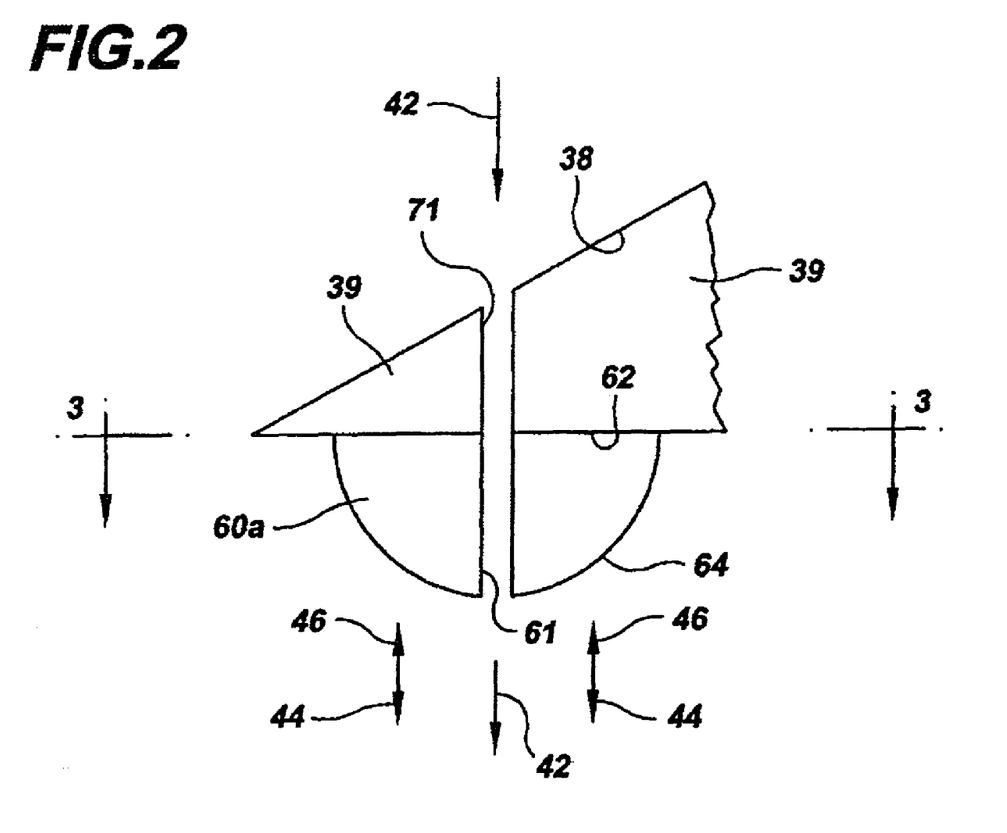
FIG. 2 is a close-up side elevational view of FIG. 1 showing one embodiment of the lens employed in the device of FIG. 1, wherein the lens and prism have a circular central opening for passage of an ion beam.
Figure 3:
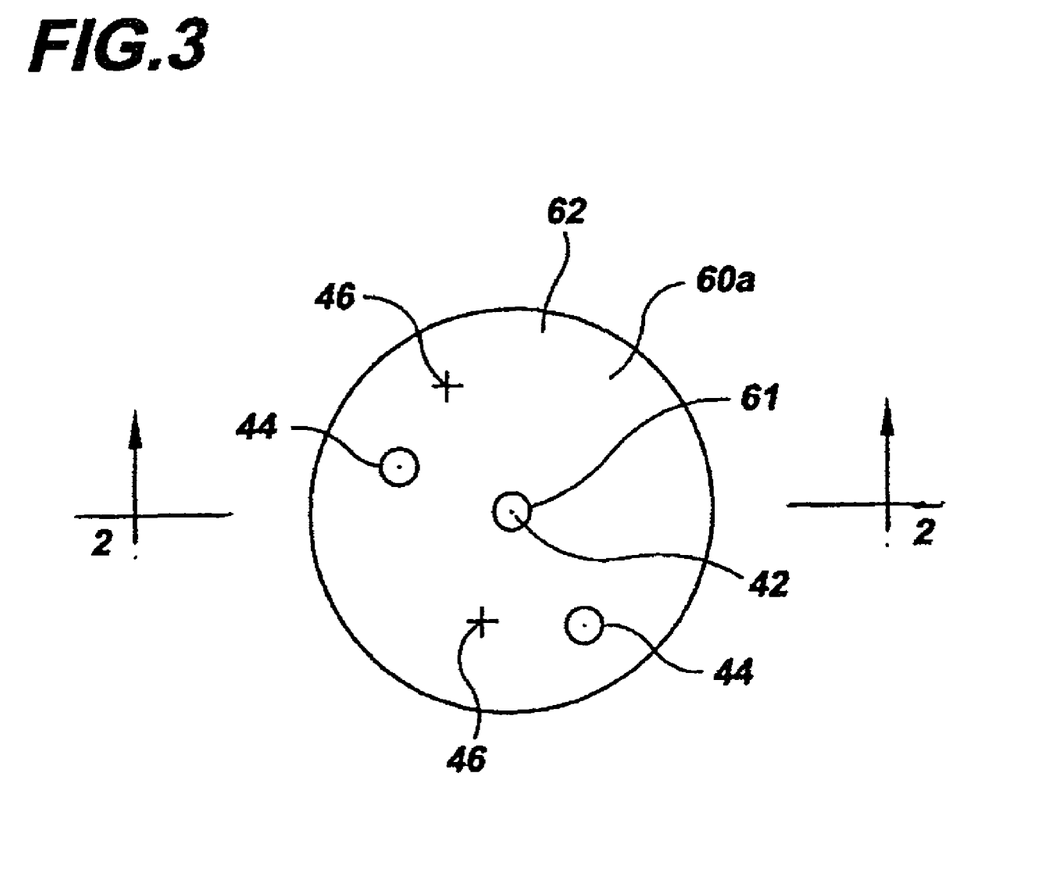
FIG. 3 is a top plan view of the lens of FIG. 2 along lines 2-2.

The lens embodiment with a circular hole is shown in FIGS. 2 and 3. Plano-convex lens 60*a* is secured to the bottom surface of prism 39, and a circular hole or opening is formed vertically having a portion 61 passing through the lens central optical axis of the lens and also a portion 71 passing through prism 39. Openings 61, 71 may be formed by mounting micro drill bits with diameter of 200 µm in a lathe and drilling at a rotational speed of about 4000 rpm and a feed of about 2 microns per minute. Drill speeds of up to about 150,000 rpm may be used. While drilling, coolant should be maintained around the drill region to prevent the heating of the drill and damage to the drill and lens. The lens typically has a diameter of about 1.5 mm and a thickness of about 0.8 mm at opening 61, with a focal length of 1 mm and a numerical aperture value of 0.75.

A hole 71 may be drilled through prism 39 in a manner similar to that used for the lens. The thickness of the prism is typically about 1.5 mm at opening 71. The prism is aluminum coated to form reflective surface 38, and has an overlying carbon coating on the exterior. During drilling, the prism may be adhered to a glass slide and a ring of epoxy created around the prism to make a reservoir for coolant. Drill speed and fee rates are similar to those used for the lens. The finished hole diameter using the 200 µm drill bit has been measured as about 220 µm in both the prism and the lens. The lens and prism may be drilled separately and then secured as shown in FIG. 2 with a suitable adhesive, such as optically transparent UV-curable epoxy available from Norland Products Inc., of North Brunswick, N.J.

In operation, ion beam 42 passes through the openings 41, 71 in the lens and prism, respectively. The light energy 44 going toward the sample and the light energy 46 reflected back from the sample pass through lens 60*a* and prism 39 in regions other than the openings therein. Tests have shown that when the field of view is reduced to 30 µm, so that the beam scans inside the hole, visible image distortion is greatly reduced, and parallel or simultaneous FIB and optical imaging is achievable. This ability to engage in parallel processing, where FIB tool ion beam can be used simultaneously with the optical microscope, is in contrast with serial processing, where the user cannot operate the FIB and optical components simultaneously (such as where the microscope blocks the path of the ion beam when extended into viewing position). The light source is believed to act like a point source and generate a spherical wavefront, so that the principal or axial rays do not participate in forming an image. This may possibly lead to a reduced depth of focus and improved surface contrast. It should also be noted that the concentricity of the optical and FIB image is dependent on the alignment of different components involved in the image formation and projection. It has been found that the image formed using the lens having the central opening provides enhanced edge definition, similar to that provided by dark field imaging.

Figure 4:
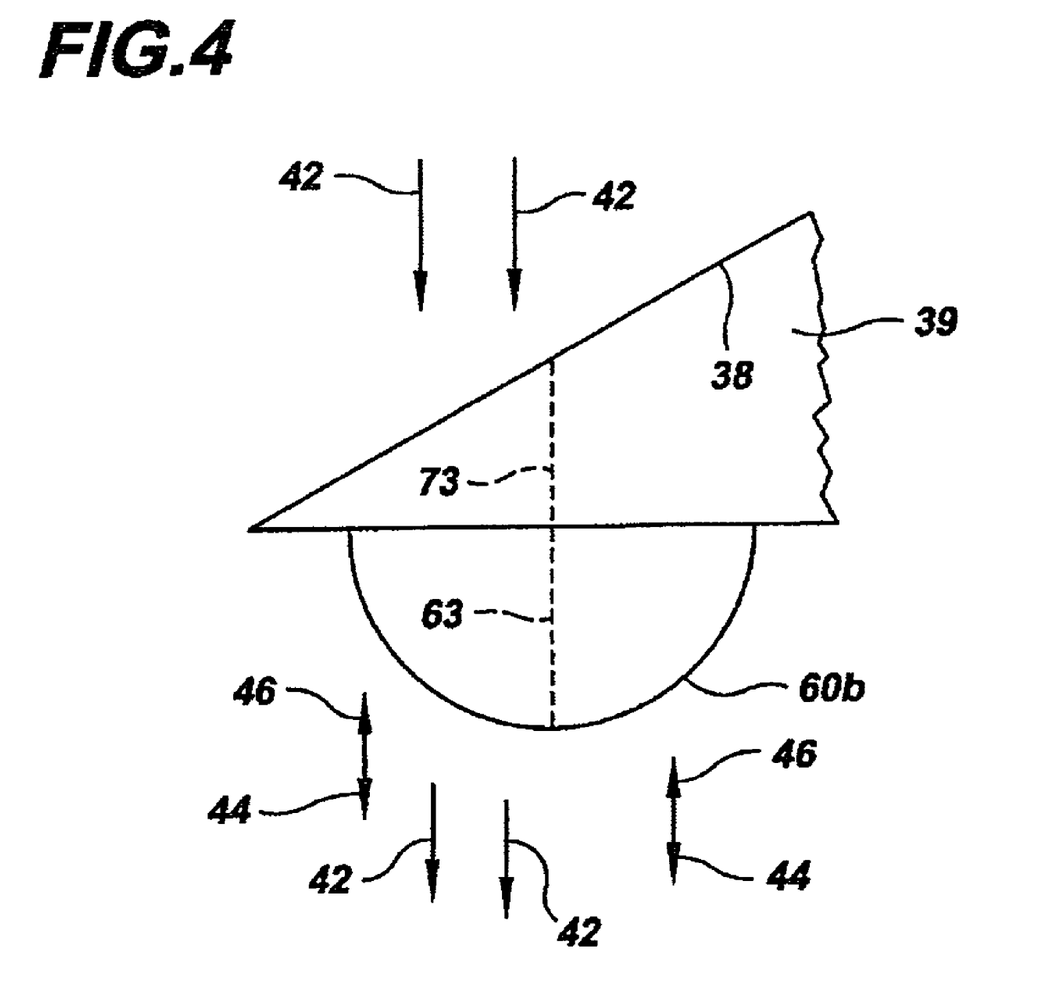
FIG. 4 is a dose-up side elevational view of FIG. 1 showing another embodiment of the lens employed in the device of FIG. 1, wherein the lens and prism have a slotted opening for passage of an ion beam.
Figure 5:
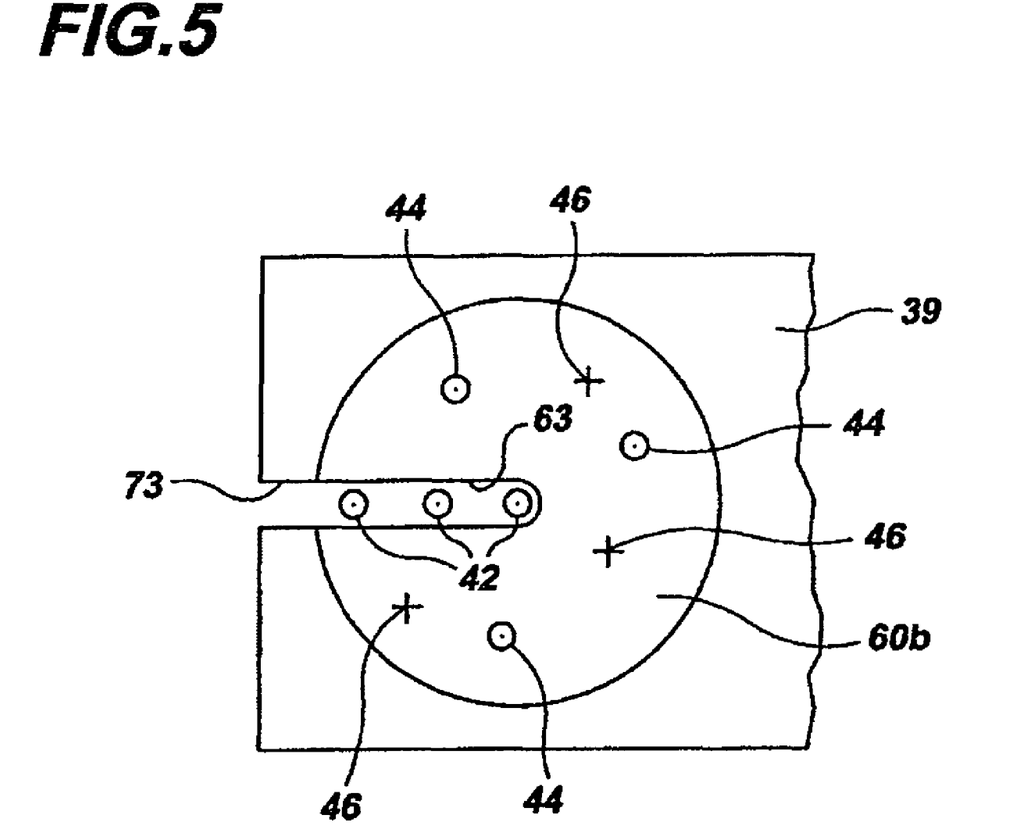
FIG. 5 is a bottom plan view of the lens of FIG. 4

A second embodiment of the lens is shown in FIGS. 4 and 5, wherein prism 39 and lens 60*b* have slotted grooves or notches 73, 63, respectively. Lens 60*b* and prism 39 are of the same type as the lens and prism used in the previous embodiment. To make the slotted groove, a full lens 60*b* may be adhered to the prism with the aforedescribed optically transparent UV-curable Norland epoxy. The assembly may be mounted on a glass slide with glycol epoxy surrounding the lens/prism assembly from all sides, including a thin layer at the top. A thin tungsten wire having a diameter of about 50 µm may be used to cut a notch by sawing carefully using a 15 µm diamond slurry paste. The completed grooves 63, 73 have a width of about 150 µm and a depth of about 800 µm, and extend from the edge of the lens and prism to the central optical axis of the lens as shown in FIG. 5. During operation ion beam 42 may pass through the slot 63 containing the lens central optical axis and prism slot 73, while light rays 44, 46 pass through the remaining lens and prism. While simultaneous optical/FIB imaging can be achieved, it is believed that the quality of the optical image is lower than that using the central circular opening of the previous embodiment.

Figure 6:
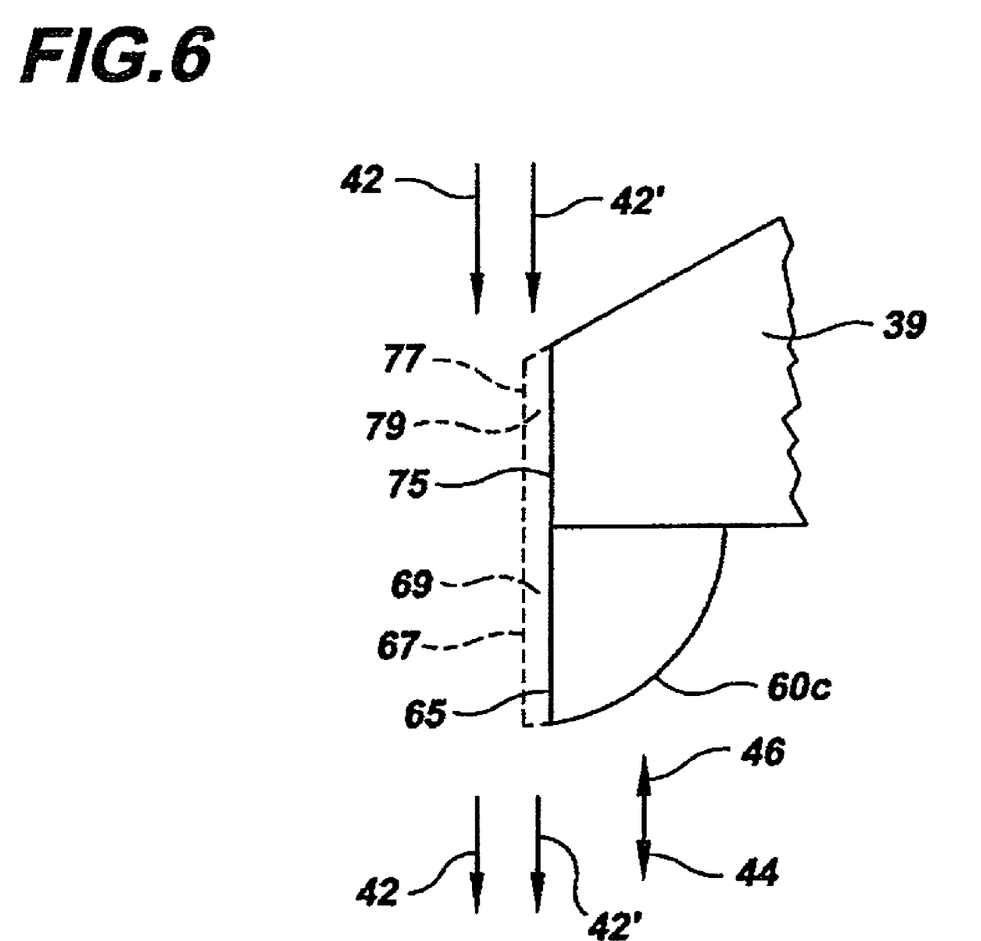
FIG. 6 is a close-up side elevational view of FIG. 1 showing another embodiment of the lens employed in the device of FIG. 1, wherein the lens and prism have a cut away portion for passage of an ion beam.
Figure 7:
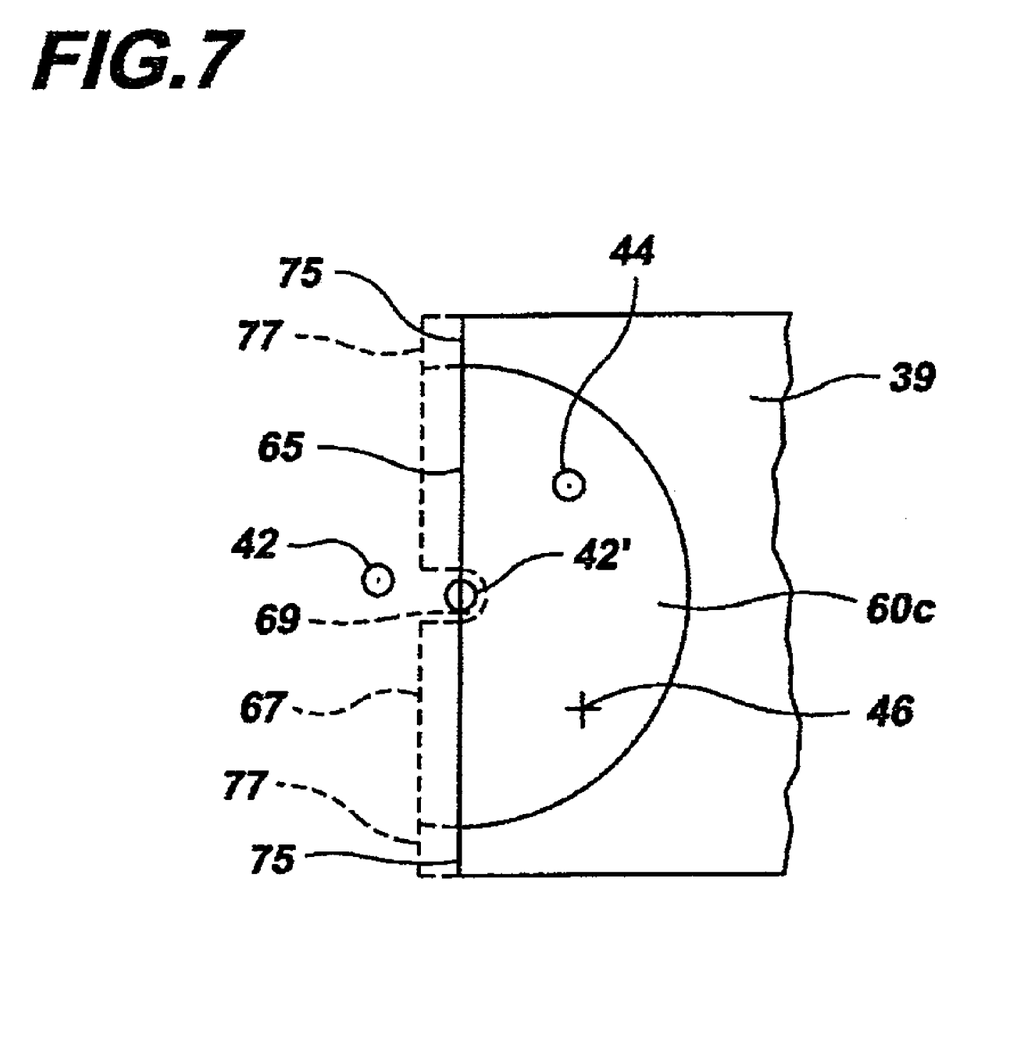
FIG. 7 is a bottom plan view of the lens of FIG. 6.

The half lens embodiment is shown in FIGS. 6 and 7. Again, lens 60*c* and prism 39 are of the same type as the lens and prism used in the previous embodiments, and are adhered together in the same manner. To make the embodiment shown, lens 60*c* and prism 39 are cut either separately or together, so that the free edge surface 65 of lens 60*c* passes through the center of the lens, and the free edge 75 at the end of prism 39 is vertically aligned therewith. This 50% half lens permits passage of light energy 44, 46 and provides roughly the same image as a full lens, with lower intensity on the side that has been ground away. If the half lens is inclined at a slight angle (less than 5° from vertical), ion beam 42 can pass by the central optical axis of the lens and strike the sample near the center of the optical field-of-view. To obtain an image with greater intensity, it is believed that at least a 55% lens is required, and is shown by free lens edge 67 and free prism edge 77. Since the extra 5% lens portion would block the ion beam from striking the same sample region as is being imaged optically, a notch 69 is formed in lens 60c, through the lens central optical axis, and a corresponding notch 79 may be formed in prism 39 to permit ion beam 42' to strike the sample in the center of the image viewed by lens 60c. Notches 69, 79 may be formed in the same manner as the notch in the previous embodiment by adhering the lens to the prism and cutting the notch with a tungsten wire or other sharp edged blade. While parallel FIB/image processing is achievable, the image quality is generally not as good as in the previous lens/prism embodiments.

Thus, the present invention provides an in-situ, high-resolution light-optical channel for optical viewing and surface processing in parallel with charged particle techniques such as FIB and SEM. The apparatus incorporates a high-resolution optical microscope that provides a working light energy beam which is coincident with the ion beam of the FIB tool. The configuration enables photochemical reactions to be made on the surface of the specimen because it can deliver high-intensity light to the surface. In the present invention, the light microscope is designed for parallel processing, in which the FIB tool's ion beam can be used simultaneously with the optical microscope. This is in contrast with serial processing, where the user cannot operate the FIB and optical components simultaneously, such as where the microscope blocks the path of the ion beam when extended into viewing position. The present invention allows high-resolution optical viewing, optically-induced photochemistry, and FIB processing all at the same time, opening up entirely new possibilities for circuit edit, mask repair, and failure analysis.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as failing within the true scope and spirit of the present invention.

Thus, having described the invention, what is claimed is:

1. An apparatus for simultaneous parallel processing of a sample using light energy for optical viewing or surface processing in parallel with a charged particle beam comprising:
   a charged particle beam generator for transmitting a charged particle beam along a path to a sample; and
   a first solid rod lens having a light energy delivery apparatus comprising a light energy source for transmitting light energy along a first path to the sample, a prism having an internal reflective surface aligned along the first light energy path to reflect light energy into a second light energy path toward the sample, a portion of the prism and reflective surface being removed for passage of the charged particle beam, a lens adapted to be aligned along the second light energy path and having a portion removed therefrom for passage of the charged particle beam, the removed portions of the prism and lens adapted to be aligned along the charged particle beam path to permit parallel delivery of the charged particle beam through the removed portions of the prism and the lens and of the second light energy path through the lens and onto substantially the same portion of the sample;
   a second solid rod lens; and
   an optical path for transmitting light energy reflected from the sample through the lens and reflected off the prism into the second solid rod lens towards a light energy detector.

2. The apparatus of claim 1 wherein the light energy delivery apparatus comprises an optical microscope and the lens is adapted to transmit light energy reflected from the sample, and wherein the first and second solid rod lenses are parallel to each other.

3. The apparatus of claim 1 wherein the light energy travels from the light energy delivery apparatus along only two light energy paths comprising the first light energy path and the reflected second light energy path that is directed toward and onto the same portion of the sample as the charged particle beam.

4. The apparatus of claim 1 wherein the light energy delivery apparatus is adapted to deliver a light energy to the sample for surface processing of the sample by a light energy induced reaction.

5. The apparatus of claim 1 wherein the light energy delivery apparatus includes a combination of a light energy delivery system for surface processing and an optical microscope.

6. The apparatus of claim 1 wherein the lens has an opening in a center portion thereof aligned along the charged particle beam path for passage of the charged particle beam toward the sample.

7. The apparatus of claim 1 wherein the lens has a substantially circular opening in a center portion thereof aligned along the charged particle beam path for passage of the charged particle beam toward the sample.

8. The apparatus of claim 1 wherein the lens has a slot extending from an edge toward a center portion thereof, the slot being aligned along the charged particle beam path for passage of the charged particle beam toward the sample.

9. The apparatus of claim 1 wherein the lens has approximately half of the lens removed, the removed portion being aligned along the charged particle beam path for passage of the charged particle beam toward the sample.

10. The apparatus of claim 1 further including a motion stage attached to the light energy delivery apparatus for moving the prism and lens into an out of the path of the charged particle beam.

11. The apparatus of claim 1 wherein the charged particle beam generator is an ion beam generator and the charged particle beam is a focused ion beam.

12. The apparatus of claim 1 wherein the charged particle beam generator is an electron beam generator and the charged particle beam is an electron beam.

13. A method for simultaneous parallel processing of a sample using light energy for optical viewing or surface processing in parallel with a charged particle beam comprising:
   providing a charged particle beam generator for transmitting a charged particle beam along a path to a sample;
   providing a first solid rod lens having a light energy delivery apparatus comprising a light energy source for transmitting light energy along a first path to the sample, a prism having an internal reflective surface aligned along the first light energy path to reflect light energy into a second light energy path toward the sample, a portion of the prism and reflective surface being removed for passage of the charged particle beam, a lens adapted to be aligned along the second light energy path and having a portion removed therefrom for passage of the charged particle beam, the removed portions of the prism and lens adapted to be aligned along the charged particle beam path to permit parallel delivery of the charged particle beam and the light energy to substantially the same portion of the sample;

providing a second solid rod lens;

delivering light energy through the first solid rod lens from the light energy source of the light energy delivery apparatus through the first light energy path, and reflecting the light energy from the prism reflective surface to the second light energy path, through the lens and onto a portion of the sample;

simultaneously transmitting a charged particle beam from the charged particle beam generator along a path through the removed portions of the prism and lens to substantially the same portion of the sample as the light energy; and transmitting reflected light energy from the sample through the lens and reflecting the reflected light energy off the prism into the second solid rod lens towards a light energy detector.

14. The method of claim 13 wherein the lens has a portion removed from a central optical axis of the lens, and including transmitting the charged particle beam through the lens central optical axis.

15. The method of claim 13 wherein the lens has a substantially circular opening in a center portion thereof aligned along the charged particle beam path, and including transmitting the charged particle beam through the lens circular opening.

16. The method of claim 13 wherein the lens has a slot extending from an edge toward a center portion thereof, and including transmitting the charged particle beam through the lens slot.

17. The method of claim 13 wherein the lens has approximately half of the lens removed, and including transmitting the charged particle beam through the lens half-removed portion.

18. The method of claim 13 wherein the light energy delivery apparatus comprises an optical microscope, and wherein the lens transmits light energy reflected from the sample, and wherein the first and second solid rod lenses are parallel to each other.

19. The method of claim 13 wherein the light energy travels from the light energy delivery apparatus along only two light energy paths comprising the first light energy path and the reflected second light energy path that is directed toward and onto the same portion of the sample as the charged particle beam.

20. The method of claim 13 wherein the light energy delivery apparatus delivers light energy to the sample for surface processing of the sample by a light energy induced reaction.

\* \* \* \* \*